Inventor
ROBERT A. BUCK
By M. Lombardi
Attorney

Inventor
ROBERT A. BUCK
By M. Lombardi
Attorney

Inventor
ROBERT A. BUCK
By M. Lombardi
Attorney

United States Patent Office 3,506,850
Patented Apr. 14, 1970

3,506,850

AMPLIFIER WITH BINARY OUTPUT

Robert Arthur Buck, Barnet, England, assignor to International Standard Electric Corporation, New York, N.Y., a corporation of Delaware Filed Jan. 3, 1967, Ser. No. 606,674
Claims priority, application Great Britain, Feb. 4, 1966, 4,969/66
Int. Cl. H03k *17/00*
U.S. Cl. 307—239 4 Claims

ABSTRACT OF THE DISCLOSURE

This invention relates to an amplifier which produces a binary output signal from an input signal which may, for example, be of sinusoidal or trapezoidal waveform. The amplifier is provided with a selector switch which enables one of a number of differing types of output signals to be selected without modification of the external connections to the amplifier such as by removing or patching-in external links.

Summary of the invention

According to the invention there is provided an amplifier to produce a binary output current in a load in response to an input signal including a first semiconductor switch responsive to the input signal, a first current supply, a second current supply, a second semiconductor switch, and a selector switch having at least two positions, wherein the selector switch at a first setting thereof connects the first current supply in series with the load and the first semiconductor switch, and at a second setting thereof connects the first and second current supplies in series with the load through the first and second semiconductor switch and at the second setting thereof so interconnects the first and second semiconductor switches that the second semiconductor switch is open when the first semiconductor switch is closed and is closed when the first semiconductor switch is open.

One aim of the invention is to provide an amplifier which produces a binary output signal from a given input signal, which may, for example, be of trapezoidal or sinusoidal waveform, and in which by various settings of a selector switch binary output currents of various values and/or polarities may be obtained. For example, variation of the setting of the selector switch may change the output signal from single current to double current form, or from single current of one polarity to single current of the opposite polarity.

One feature of the invention is that by using semiconductor devices as switching elements it is usually possible to amplify successfully signals having much higher frequencies than would be possible by the use of equipment employing electro-mechanical relays.

The term "semiconductor switch" as used in this specification refers to a semiconductor device which is operated as a bistable switching element, the two operating conditions of which are conducting and non-conducting, respectively, depending upon the control signal applied to the device. Such a semiconductor switching device could be constituted by a transistor, four-layer device or silicon-controlled rectifier.

Description of preferred embodiments

Figure 1:
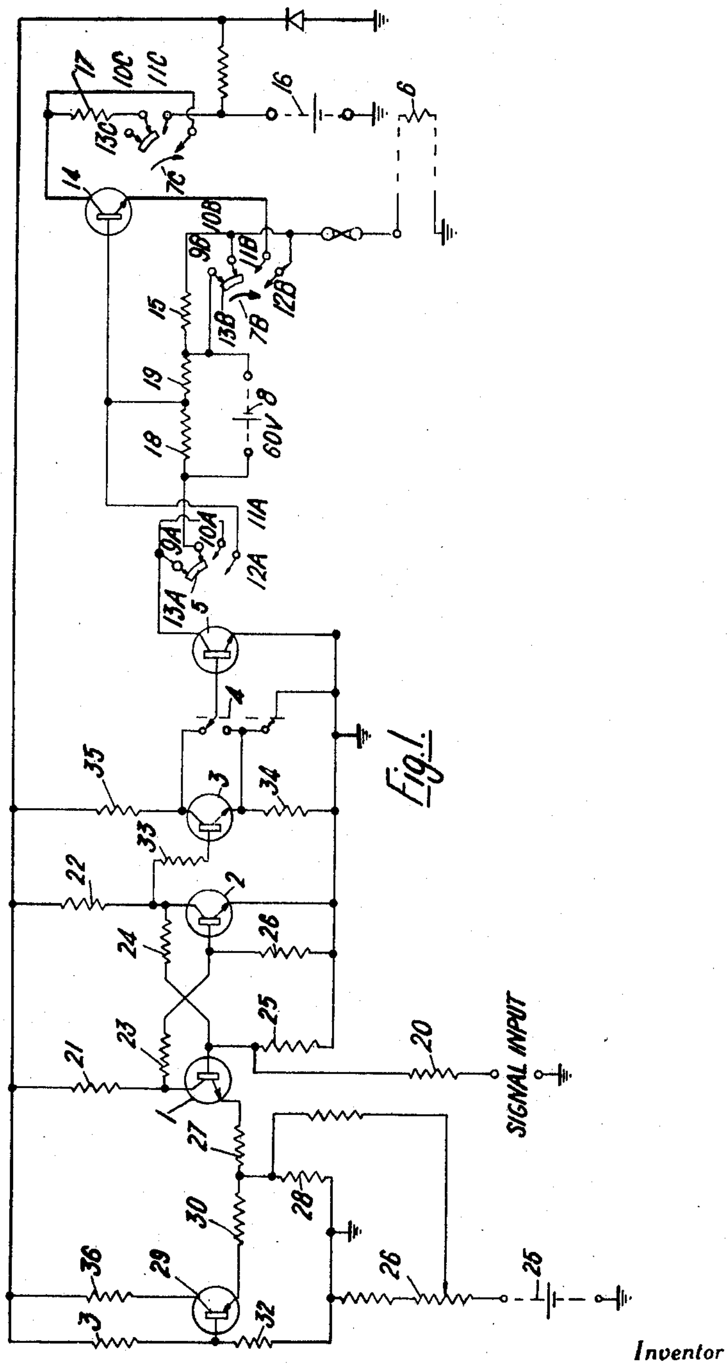
FIG. 1 is a circuit diagram of the demodulated telegraph signal amplifier of a radio telegraph receiver.

FIG. 1 shows a bistable trigger circuit comprising the transistors 1 and 2 and associated components, a polarity inverter stage which incorporates the transistor 3 and change-over switch 4, and an output amplifier stage which comprises a first transistor switch 5, an output load resistance 6, and a three-position selector switch having three banks which are ganged 7A, 7B and 7C which connects the output of the transistor switch 5 to the load 6 through any one of three different circuit arrangements which will be described later on.

The part of the amplifier circuit lying to the right of the base-emitter circuit of the transistor 5 will first be described. The simplified drawings of FIGS. 2A, 2B and 2C feature this part of the amplifier.

The signal applied between base and emitter of the transistor 5 is a binary signal the values of which is either zero or a positive value, as will be described later on. The emitter of the transistor 5 is connected directly to earth, and the collector is connected to the load 6 by the fixed and movable contacts of the switch banks 7A, 7B and 7C and any one of three different circuit arrangements connected between the sets of contacts.

Figure 3A:
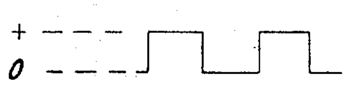
FIGS. 3A to 3F show waveforms, at different parts of the amplifier circuit under various conditions.

The transistor 5 operates as a switch being non-conducting when the signal applied between base and emitter is zero, and fully conducting when the applied signal is positive. The waveform of the signal applied between base and emitter is shown in FIG. 3A.

Figure 2A:
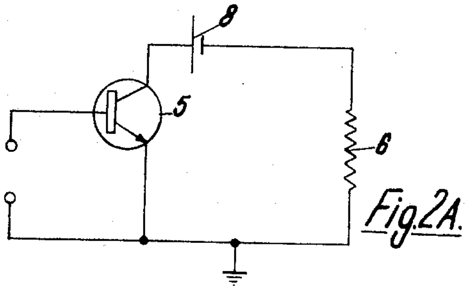
FIGS. 2A, 2B and 2C are simplified circuit diagrams of a part of the amplifier of FIG. 1 corresponding to three settings of the selector switch.
Figure 3B:
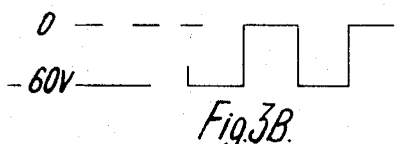

When the selector switch is at the setting shown in FIG. 1 the collector of the transistor 5 is connected through the fixed contacts 9A and 10A and the moving segment 13A of the switch-bank 7A to the positive terminal of battery 8. The negative terminal of the battery is connected through the fixed contacts 9B and 10B and the moving segment 13B of the set of contacts 7B to the load circuit. The load circuit comprises a load of 750 ohms, which is represented in FIG. 1 as a resistor but which in practice consists of the coils of two teleprinter relays connected in series. Referring to FIG. 2A, which shows the simplified circuit diagram, it is seen that in this case the circuit arrangement connected between the output of the transistor 5 and the load consists of the transistor 5 and the load consists only of the battery 8. When the voltage between the base and emitter of the transistor 5 is positive the transistor behaves as a short-circuit and the full battery voltage (60 volts) is applied across the load 6 the non-earthed terminal of the load being negative. When the voltage between the base and emitter of the transistor 5 is zero the current around the circuit comprising the transistor 5, battery 8 and load 6 is zero, therefore there is zero voltage drop across the load 6. The voltage waveform across the load 6 is shown in FIG. 3B.

At the next setting of the selector switch the moving segment 13A short-circuits contacts 10A and 11A of the switch-bank 7A, and the collector of the transistor 5 is again connected to the positive terminal of the battery 8. The moving segment 13B short circuit contacts 10B and 11B of the switch bank 7B thereby connecting the emitter of a transistor 14 to the load 6. Moreover, the negative terminal of the battery 8 is also connected to the load 6 through a resistor 15 having a resistance value equal to that of the load 6. The collector of the transistor 14 is connected to the positive terminal through a resistor 17 having a value equal to the resistance of the load 6, 750 ohms, of a further 60 volt battery 16, the negative terminal of which is earthed. The base of the transistor 14 is connected to the fixed contact 12A, which is isolated at this setting of the selector switch, and also to the junction of two resistors 18 and 19 which are connected across the terminals of the battery 8. The resistors 18 and 19 have values of 15,000 and 12,000 ohms, respectively.

Figure 2B:
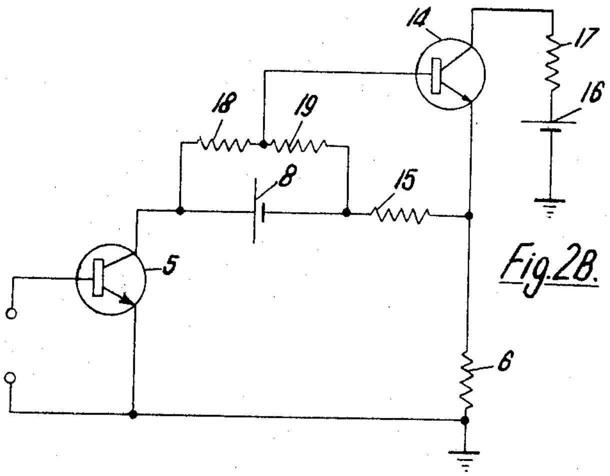

FIG. 2B shows the simplified circuit diagram corresponding to this setting of the selector switch.

Figure 3C:
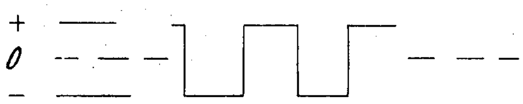

The waveform of the voltage applied between base and emitter of the transistor 14 is shown in FIG. 3C.

When the value of the binary signal applied to the base-emitter circuit of the transistor 5 is zero, the transistor is non-conducting, and the battery 8 causes a current to flow from the base to the emitter of the transistor 14. This base to emitter current is sufficient to render the transistor 14 fully conducting, i.e. its impedance may be regarded as sensibly zero and a current flows from the 60 volt battery 16 through the collector to emitter circuit of the transistor and the load 6. The current flowing through the load 6 will be $$\frac{60}{0.75+0.75}\text{ ma.}=40\text{ ma.}$$

The non-earthed terminal of the load 6 being positive with respect to earth.

When the value of the binary signal applied to the base-emitter circuit of the transistor 5 is positive, the transistor becomes an effective short circuit which connects the positive terminal of the battery 8 to earth. This causes the base of the transistor 14 to be at a negative potential with respect to the emitter and the transistor is completely cut off. However, since transistor 5 is fully conducting a current flows from the positive terminal of the battery 8 through the load 6 and the resistor 15 to the negative terminal of the battery. The magnitude of this current is again 40 ma., but it is in a direction such as to make the non-earthed terminal of the load 6 negative with respect to earth.

Figure 3D:
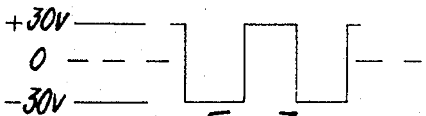

Thus, at this setting of the selector switch a single current signal at the input of the transistor 5 produces a double current signal of $\pm 40$ ma. in the load 6. The waveform of the voltage across the load 6 is shown in FIG. 3D.

At the next setting of the selector switch the segment 13A short circuits the contacts 11A and 12A, thereby directly connecting the collector of the transistor 5 to the base of the transistor 14. The segment 13B short-circuits the contacts 11B and 12B which in effect does not alter the nature of the connection between the negative terminal of the battery 8 and the emitter of the transistor 14 as compared with the previous setting of the selector switch. The segment 13C short-circuits 11C and 12C thereby connecting the collector of the transistor 14 directly to the positive terminal of the battery 16, the 750 ohm resistor 17 being effectively by-passed.

Figure 2C:
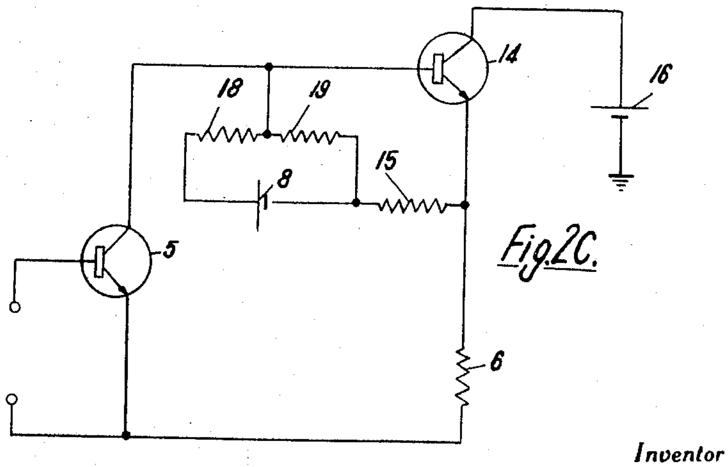

The simplified circuit diagram is shown in FIG. 2C. When the transistor 5 is in the non-conducting condition the battery 8 causes a current to flow from the base to the emitter of the transistor 14, the value approaching 4 ma. This is sufficient to cause the transistor to conduct fully, the current through the load 6 being $$\frac{60}{0.75}\text{ ma.}=80\text{ ma.}$$

the non-earthed terminal of the load 6 being positive with respect to ground.

Figure 3E:

When the transistor 5 is in the conducting condition, the base of the transistor 14 is effectively earthed. The base of the transistor 14 must be positive with respect to the emitter by 0.6 volt before current flows in the base-emitter circuit. If the base-emitter voltage is less than 0.6 volt the collector-emitter impedance of the transistor 14 is substantially infinite. The waveform of the voltage applied between the base and the emitter of the transistor 14 is shown in FIG. 3E.

If it is first assumed that the transistor 14 is removed, i.e. its collector-emitter impedance is infinite, then the voltage across the load 6 is equal to $$\frac{0.75}{0.75+15}\times 60\text{ volt}$$

which is approximately 3 volts. That is to say the potential of the non-earthed terminal of the load 6 is 3 volts with respect to earth.

With the transistor 14 in circuit the impedance between collector and emitter is not infinite and the voltage across the load 6 falls to a value slightly greater than 0.6 volt in order to maintain a finite value for the collector-emitter impedance of the transistor 14. In this condition the current through the load 6 is $$\frac{0.6}{0.75}\text{ ma.}=0.4\text{ ma.}$$

The load current in this condition is therefore sensibly zero in contrast to when the transistor 5 is non-conducting, the load current then being 80 ma.

Figure 3F:
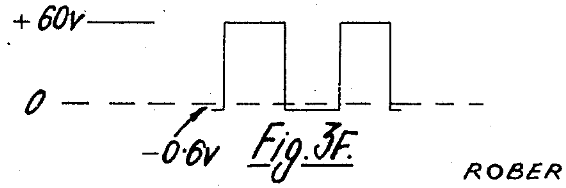

When the transistor 5 is non-conducting it can be shown that the emitter-base potential of the transistor 14 tends to remain constant at a value slightly greater than 0.6 volt with changes in the voltage of the battery 8 and with temperature changes. The waveform of the voltage across the load 6 is shown in FIG. 3F.

The part of the circuit of the amplifier lying to the left of the base-emitter circuit of the transistor 5 will now be described.

The input signal to the amplifier is applied through a buffering resistor 20 to the emitter of the transistor 1 of the bistable trigger circuit. The transistors 1 and 2 have collector loads 21 and 22, respectively, and the collector of the transistor 1 connected to the base of the transistor 2 through a current limiting resistor 23. Similarly the collector of the transistor 2 is connected to the base of the transistor 1 through a current-limiting resistor 24. The bases of the transistors 1 and 2 are returned to earth through resistors 25 and 26. The emitter of the transistor 2 is directly earthed, the emitter of the transistor 1 is returned to earth through a resistor 27 in series with a further resistor 28.

The input signal may be either of sinusoidal or trapezoidal waveshape, and is a double-current signal. Only one of the transistors 1 and 2 is conducting at any time. When the input signal exceeds 0.2 volt the circuit triggers, transistor 1 becoming conducting the transistor 2 becoming cut-off. The output from the trigger circuit is obtained from the collector of the transistor 2, the output waveform being rectangular. Since the trigger voltages are both positive, a double current input signal of trapezoidal or sinusoidal waveform will therefore tend to give rise to bias distortion at the collector of the transistor 2. This corrected by feeding an adjustable negative bias to the emitter of the transistor 1 from a battery 25 through a variable resistor 26.

Moreover, with a trapeodial or sinusoidal input signal any variation of the average value of the collector-emitter current of the transistor 1 will also cause bias distortion. Such a variation might readily arise through temperature variation. This effect is reduced by having a further transistor 29, having collector, base and emitter average operating currents of the same value as those of the transistor 1. The resistor 28 is common to the emitter circuits of the transistors 1 and 29 and is connected to the emitter of the transistor 28 through a buffering resistor 30. The resistance value of collector load resistor 30 of the transistor 28 is equal to the resistance value of the resistor 21. The base of the transistor 29 is fed from the D.C. supply to the amplifier through a potential divider network consisting of the resistors 31 and 32. The transistor 29 has the same nominal electrical characteristics as the transistor 1.

The output signal from the trigger circuit is fed through a circuit limiter resistor 33 to the base of the transistor 3. As previously stated, this transistor in conjunction with the two-pole change-over switch 4 functions as a polarity inverter.

The emitter and collector of the transistor 3 are returned to the positive and negative terminals, respectively, of the D.C. supply through resistors 34 and 35, respectively, having equal values. When the switch 4 is in the position shown in FIG. 1, the signal applied to the base of the transistor 5 will be of opposite polarity to the input signal, for in this position one pole of the switch 4 connects the base of the transistor 5 to the collector of the transistor 3, while the second pulse of the switch short-circuits the emitter resistor 34. When the switch 4 is set to the alternative position the signal applied to the base of the transistor 5 is of the same polarity as the input signal, for in this position one pole of the switch 4 connects the emitter of the transistor 3 to the base of the transistor 5, while the other pole of the switch is disconnected from the emitter.

The operation of the circuit is summarized in the table below:

| Output | Positions Switch 4 | Positions 7A, 7B, 7C | Input signal polarity | Output signal Volts | Output signal Current (ma.) |
|---|---|---|---|---|---|
| Negative Normal | 1 | 1 | ± | 0 | 0 |
| | | | | −60 | −80 |
| Negative Inverted | 2 | 1 | ± | −60 | 80 |
| | | | | 0 | 0 |
| Double current Normal | 1 | 2 | ± | +30 | 40 |
| | | | | −30 | 40 |
| Double current Inverted | 2 | 2 | ± | −30 | 40 |
| | | | | +30 | 40 |
| Positive Normal | 1 | 3 | ± | +60 | 80 |
| | | | | −0.5 | 0.6 |
| Positive Inverted | 2 | 3 | ± | −0.5 | 0.9 |
| | | | | +60 | 80 |

In the above table the switch positions are numbered consecutively from the anti-clockwise position.

If the input signal was of rectangular waveform and of the correct amplitude and the facility for inversion of the signal polarity was not required the input signal could be applied directly to the base-emitter circuit of the transistor 5.

It is to be understood that the foregoing description of specific examples of this invention is made by way of example only and is not to be considered as a limitation on its scope.

What I claim is:

1. An amplifier to produce a binary output current in a load in response to an input signal comprising:

a first transistor switch, having a base, emitter, and collector, and responsive to the input signal;

a first current supply;

a second current supply;

a second transistor switch having a base, emitter, and collector;

a selector switch having at least three positions, wherein the selector switch at a first setting thereof connects the first current supply in series with the load and the first transistor switch, at a second setting thereof connects the first and second current supplies in series with the load through the first and second transistor switches, so that the second transistor switch is open when the first transistor switch is closed and is closed when the first transistor switch is open, and at a third setting thereof connects the second current supply in series with the load through the second transistor switch, so that the second transistor switch is open when the first transistor switch is closed and is closed when the first transistor switch is open; and the collector-emitter path of the first transistor switch is included in the circuit between the base and the emitter of the second transistor switch, and the load is connected in series with the collector-emitter path of the second transistor switch.

2. An amplifier as claimed in claim 1 including a bistable trigger circuit connected between the input of the amplifier and the input of the first transistor switch, the trigger circuit being arranged to transfer from one of two stable conditions to the other in response to the magnitude and polarity of the input signal.

3. An amplifier as claimed in claim 2 wherein the trigger circuit includes at least one transistor stage and the drift of the collector-emitter current of the transistor with temperature is reduced by connecting the emitter of the transistor to the emitter of a second transistor having similar electrical characteristics to the first transistor, both transistors having a common emitter feed resistor and the D.C. current feed resistors to the collector and emitter of the second resistor have resistance values such that the electrical operating conditions the second transistor are similar to the electrical operating condition of the first transistor.

4. An amplifier as claimed in claim 3 including a polarity inverter stage comprising a transistor amplifier and switching means to select a signal from either the emitter or the collector of the transistor.

References Cited

UNITED STATES PATENTS 3,160,766 12/1964 Reymond __________ 307—255
3,346,698 10/1967 Bradford ___________ 307—255

DONALD D. FORRER, Primary Examiner

B. P. DAVIS, Assistant Examiner

U.S. Cl. X.R.

307—247, 264